United States Patent
Na et al.

(10) Patent No.: US 10,937,383 B2
(45) Date of Patent: *Mar. 2, 2021

(54) DISPLAY DEVICE

(71) Applicant: SAMSUNG DISPLAY CO., LTD., Yongin-si (KR)

(72) Inventors: Yeon-Sun Na, Yongin-si (KR); Bo-Ram Kang, Gwangmyeong-si (KR); Jeong Hun Go, Asan-si (KR); Jae Hoon Lee, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/570,388

(22) Filed: Sep. 13, 2019

(65) Prior Publication Data

US 2020/0005724 A1 Jan. 2, 2020

Related U.S. Application Data

(63) Continuation of application No. 15/826,020, filed on Nov. 29, 2017, now Pat. No. 10,424,264.

(30) Foreign Application Priority Data

Dec. 5, 2016 (KR) ........................ 10-2016-0164547

(51) Int. Cl.
*G06F 1/32* (2019.01)
*G09G 3/36* (2006.01)
(Continued)

(52) U.S. Cl.
CPC ......... *G09G 3/3688* (2013.01); *G09G 3/2092* (2013.01); *G09G 3/3696* (2013.01);
(Continued)

(58) Field of Classification Search
None
See application file for complete search history.

(56) References Cited

U.S. PATENT DOCUMENTS 6,975,314 B2 * 12/2005 Kashiyama .......... G09G 3/3696
323/907
8,033,351 B2 10/2011 Tuli
(Continued)

FOREIGN PATENT DOCUMENTS

| JP | 2014-153392 | 8/2014 |
| KR | 10-2005-0039925 | 5/2005 |
| KR | 10-2016-0050567 | 5/2016 |

OTHER PUBLICATIONS

Office Action dated Dec. 14, 2018 in Corresponding U.S. Appl. No. 15/826,020.

*Primary Examiner* — Joseph R Haley
(74) *Attorney, Agent, or Firm* — F. Chau & Associates, LLC

(57) ABSTRACT

A display device and method of operation that provides self-generated power. The device includes: a display portion including a plurality of pixels; a data driver applying a data signal to data lines connected to the plurality of pixels; a signal controller transmitting an image data signal for generation of the data signal to the data driver; a power supply generating a driving voltage for operation of the signal controller and the data driver; a thermoelectric generation portion generating electrical energy by using heat generated by at least one of the signal controller, the power supply, and the data driver; and a converter generating an auxiliary driving voltage that is the same as the driving voltage by using the electrical energy.

20 Claims, 15 Drawing Sheets

(51) Int. Cl.
  *H01L 35/30* (2006.01)
  *G09G 3/20* (2006.01)
  *G06F 1/3234* (2019.01)

(52) U.S. Cl.
  CPC ............ *H01L 35/30* (2013.01); *G06F 1/32* (2013.01); *G06F 1/3265* (2013.01); *G09G 3/3677* (2013.01); *G09G 2310/0289* (2013.01); *G09G 2330/02* (2013.01); *G09G 2330/023* (2013.01); *G09G 2330/12* (2013.01)

(56) References Cited

U.S. PATENT DOCUMENTS

| | | |
|---|---|---|
| 2011/0196689 A1* | 8/2011 | Otani .................. G06F 1/32 705/1.1 |
| 2011/0267297 A1 | 11/2011 | Yamazaki et al. |
| 2012/0038175 A1 | 2/2012 | Tang et al. |
| 2014/0014154 A1* | 1/2014 | Hayashi ............. H01L 35/32 136/205 |
| 2016/0013671 A1 | 1/2016 | Yang et al. |
| 2016/0358526 A1 | 12/2016 | Wang et al. |
| 2017/0284708 A1 | 10/2017 | Wang et al. |
| 2018/0158429 A1 | 6/2018 | Na et al. |

* cited by examiner

DISPLAY DEVICE

CROSS-REFERENCE TO RELATED APPLICATION(S)

This application is a continuation application of U.S. patent application Ser. No. 15/826,020 filed Nov. 29, 2017, which claims priority to and the benefit of Korean Patent Application No. 10-2016-0164547 filed in the Korean Intellectual Property Office on Dec. 5, 2016, the entire contents of which are incorporated their references herein.

TECHNICAL FIELD

The inventive concept relates to a display device. More particularly, the present inventive concept relates to a display device that can self-generate power.

DISCUSSION OF THE RELATED ART

Display devices such as a liquid crystal display (LCD), a light emitting diode (LED) display, and the like include a plurality of pixels for displaying an image. The plurality of pixels are often arranged in a matrix format, and a plurality of gate lines extending in a row direction are connected to a plurality of data lines extending in a column direction. The pixels receive a gate signal applied through a gate line and a data signal applied through a data line in synchronization with the gate signal.

Various methods have been suggested to reduce the power consumption of such a display device. However, as display device technology continues to develop, the panel size of the display device and resolution of the display device has increased. Power consumption of such display devices tends to increase as panel size and/or resolution increases. Accordingly, a technique for reducing power consumption of the display device is becoming increasingly urgent.

The above information disclosed in this section of the disclosure is only for enhancement of understanding of the inventive concept and therefore it may contain information that does not form the prior art that is already known in this country to a person of ordinary skill in the art.

SUMMARY

The inventive concept provides a display device that may have reduced power consumption.

A display device according to the inventive concept may include: a display portion including a plurality of pixels; a data driver applying a data signal to data lines connected to the plurality of pixels; a signal controller transmitting an image data signal to the data driver to generate the data signal; a power supply generating a driving voltage for operation of the signal controller and the data driver; a thermoelectric generation portion (e.g. thermoelectric generator) that generates electrical energy by using heat generated by at least one of the signal controller, the power supply, and the data driver; and a converter generating an auxiliary driving voltage that is substantially equal to (e.g. about the same) the driving voltage by using the electrical energy.

According to the inventive concept, the converter may convert a voltage of the electrical energy generated by the thermoelectric generator to provide the auxiliary driving voltage at a reduced level.

For example, the driving voltage may include a first driving voltage and a second driving voltage, the signal controller may be supplied with both the first driving voltage and the second driving voltage, and the data driver may be supplied with the second driving voltage.

The auxiliary driving voltage may include, for example, a first auxiliary driving voltage and a second auxiliary driving voltage, the first auxiliary driving voltage may be supplied to the signal controller as a voltage that is the same as the first driving voltage, and the second auxiliary driving voltage may be supplied to the signal controller and the data driver as a voltage that is the same as the second driving voltage.

The converter may include: a first converter that converts the electric energy supplied by the thermoelectric generator to the first auxiliary driving voltage; and a second converter that converts the electric energy supplied by the thermoelectric generator to the second auxiliary driving voltage, wherein the first converter and the second converter may be a step-down converter that steps down a voltage of the electrical energy generated by the thermoelectric generation portion to a particular voltage value.

The display device may further include: a display panel where the display portion is disposed; a printed circuit board where the signal controller, and the power supply are disposed; and a flexible printed circuit board connected between the display panel and the printed circuit board, and where the data driver is disposed.

The display device may further include, for example, a heat dissipation substrate that is disposed at a rear side of the display panel, wherein the thermoelectric generation portion may be disposed between the printed circuit board and the heat dissipation substrate.

The thermoelectric generation portion may include, for example, a high-temperature portion that contacts the printed circuit board and a low-temperature portion that contacts the heat dissipation substrate.

The thermoelectric generation portion may overlap at least one of the signal controller and the power supply.

The display device may further include a backlight unit that emits light toward the display portion, wherein the thermoelectric generation portion may generate the electrical energy by using heat generated by the backlight unit.

The backlight unit may include a light source portion that partially overlaps the printed circuit board, and the thermoelectric generation portion may include a high-temperature portion that overlaps the light source portion and a low-temperature portion that does not overlap the light source portion, and may be disposed on the printed circuit board.

The thermoelectric generation portion may be disposed on the printed circuit board, and may include a high-temperature portion that is disposed adjacent to at least one of the signal controller and the power supply and a low-temperature portion that is disposed in a portion having a relatively low temperature in the printed circuit board.

The display device may further include: a gate driver circuit that applies a gate signal to gate lines connected to the plurality of pixels; a plurality of clock wires connected to the gate driver; and common voltage wires transmitting a reference voltage to the plurality of pixels, wherein the thermoelectric generation portion may overlap the plurality of clock wires and the common voltage wires.

The thermoelectric generation portion may be disposed on a display panel where the plurality of pixels, the plurality of clock wires, and the common voltage wires are disposed.

The thermoelectric generation portion may include a high-temperature portion that overlaps the plurality of clock wires and a low-temperature portion that overlaps the common voltage wires.

The display device may further include a storage portion charging electrical energy generated by the thermoelectric generation portion, wherein the storage portion may discharge the charged electrical energy to the converter.

The display device may further include, for example, a voltage detector that detects whether a voltage of the electrical energy generated by the thermoelectric generation portion exceeds a threshold voltage, and transmits an enable signal that operates the converter to the converter when the voltage of the electrical energy exceeds the threshold voltage.

A display device according to an embodiment of the inventive concept may includes: a display portion including a plurality of pixels; a data driver applying a data signal to data lines connected to the plurality of pixels; a signal controller transmitting an image data signal to the data driver for generation of the data signal; a power supply generating a driving voltage to operate the signal controller and the data driver; and a thermoelectric generation portion generating electrical energy by using heat generated by at least one of the signal controller, the power supply, and the data driver, wherein the power supply includes: a power converter generating the driving voltage; a switch portion supplying one of a panel power voltage supplied from an external device and an auxiliary panel power source voltage generated by using the electrical energy to the power converter; and a voltage detector generating a selection signal to select one of the panel power voltage and the auxiliary panel power source voltage to be transmitted to the power converter according to the auxiliary panel power source voltage and transmitting the selection signal to the switch portion.

The display device may further include a storage portion that stores electrical energy generated by the thermoelectric generation portion and supplying the charged electrical energy to the switch portion as the auxiliary panel power source voltage. For example, the storage portion is charged by the electrical energy generated by the thermoelectric generator.

The display device may further include a charging switch connected between the thermoelectric generation portion and the storage portion, wherein the voltage detector may transmit a charge signal that turns on/turns off the charging switch according to the auxiliary panel power source voltage to the charging switch.

The display device can self-generate electric power by, for example, converting heat into electrical energy for consumption by the device. The display device may reduce external power consumption through the self-generation of electric power.

In an embodiment of the inventive concept, a display device may include: a display portion including a plurality of pixels; a data driver that applies a data signal to data lines connected to the plurality of pixels; a signal controller configured to transmit an image data signal to the data driver for generation of the data signal; a thermoelectric generator having a high-temperature portion and a low temperature portion and generates an electrical energy based on a difference in heat at the high-temperature portion and the low temperature portion; a storage device that stores the electrical energy output from the thermoelectric generator when there is a difference in heat; and a comparator that controls switching between the storage device and an external source to provide a driving voltage to at least one of the data driver and the signal controller from the storage device when a level of the stored electrical energy exceeds a threshold.

In an embodiment of the inventive concept, a method of providing self-generated power to a display device includes: providing a display portion including a plurality of pixels; applying, by a data driver, a data signal to data lines connected to the plurality of pixels; transmitting, by a signal controller, an image data signal to the data driver for generation of the data signal; generating, by a power converter connected to a power supply, a driving voltage configured to operate the signal controller and the data driver; and self-generating, by a thermoelectric generation portion, electrical energy from heat generated by at least one of the signal controller, the power supply, and the data driver, switching, by a switch portion, between a portion supplying one of a panel power voltage supplied from an external device and an auxiliary panel power source voltage output from the power converter; and generating, by a voltage detector, a selection signal to select one of the panel power voltage and the auxiliary panel power source voltage to be transmitted to the power converter according to the auxiliary panel power source voltage and transmitting the selection signal to the switch portion.

The method may also include providing a storage portion that stores electrical energy generated by the thermoelectric generation portion, and supplying the electrical energy to the switch portion as the auxiliary panel power source voltage.

In an embodiment of the inventive concept, both the storage device and the external source both provide a portion of the driving voltage. Thus, the storage device, which is charged with self-generated electrical energy via the thermoelectric generator, can reduce the power provided by the external source.

DETAILED DESCRIPTION

Figure 1:
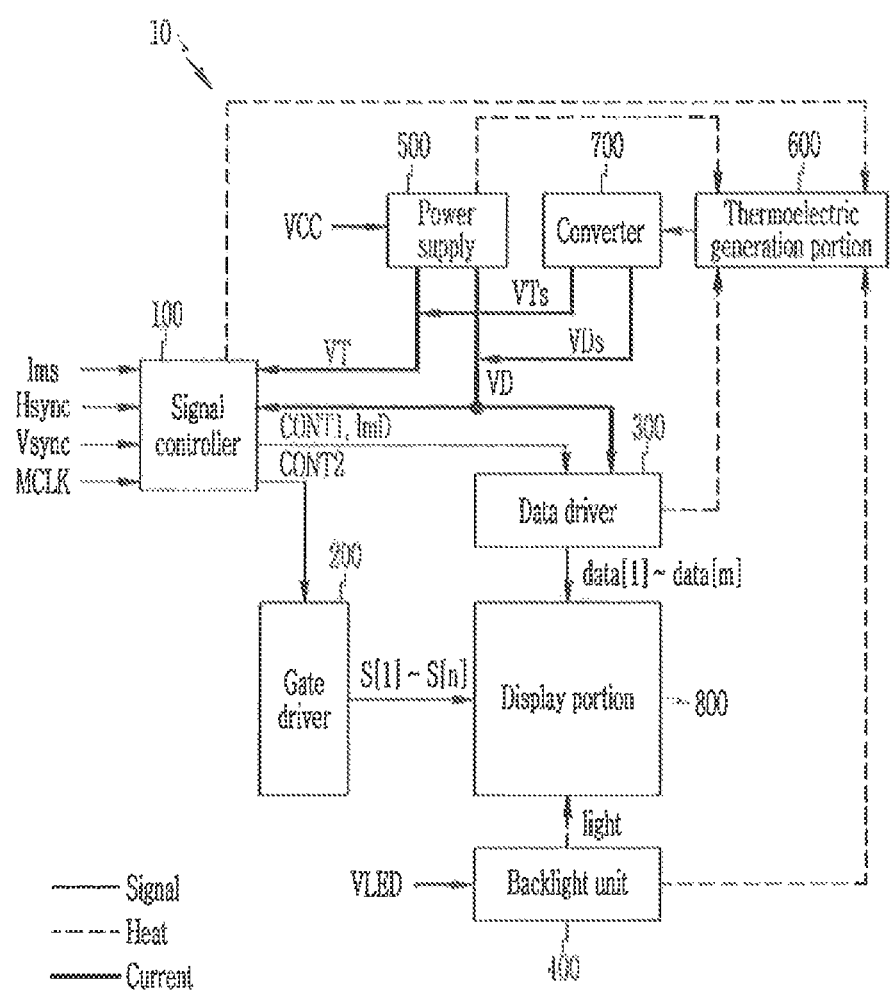
FIG. 1 is a schematic block diagram of a display device according to an embodiment of the inventive concept.

Hereinafter, embodiments of the inventive concept will be described in more detail with reference to the accompanying drawings. As those of ordinary skill in the art would understand, the described embodiments may be modified in various different ways, all without departing from the spirit or scope of the present inventive concept.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present inventive concept is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" is to be understood as referring to being positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In this specification, the phrase "on a plane" refers to viewing a target portion from the top, and the phrase "on a cross-section" means viewing a cross-section formed by vertically cutting a target portion from the side.

Also, throughout the specification, when it is referred to as "overlapped", this means that it is overlapped on the cross section, or all or part of the plane is located in the same area.

Hereinafter, referring to FIG. 1 through FIG. 11, a display device according to an embodiment of the inventive concept will be described.

FIG. 1 is a schematic block diagram of a display device according to an embodiment of the inventive concept.

Referring to FIG. 1, a display device 10 is shown in this example as being a liquid crystal display (LCD), but a person of ordinary skill in the art should understand and appreciate that the inventive concept is applicable to devices other than LCD devices. The display device 10 includes, for example, a signal controller 100, a gate driver 200, a data driver 300, a backlight unit 400, a power supply 500, a thermoelectric generation portion 600, a converter 700, and a display portion 800.

The signal controller 100 receives an input image signal ImS and a synchronization signal input from an external device. The input image signal ImS includes luminance information regarding a plurality of pixels. Luminance may have a predetermined number of gray levels, for example, the gray levels could be 1024, ($=2^{10}$), 256 ($=2^{8}$), or 64 ($=2^{6}$). The synchronization signal includes a horizontal synchronization signal Hsync, a vertical synchronization signal Vsync, and a main clock signal MCLK.

The signal controller 100 generates a first driving control signal CONT1, a second driving control signal CONT2, and an image data signal ImD according to the input video signal ImS, the horizontal synchronization signal Hsync, the vertical synchronization signal Vsync, and the main clock signal MCLK.

The signal controller 100 divides the input image signal ImS by frame units according to the vertical synchronization signal Vsync, and divides the input image signal ImS by gate line units according to the horizontal synchronization signal Hsync to generate the image data signal ImD. The signal controller 100 transmits the image data signal ImD and the first driving control signal CONT1 to the data driver 300. The signal controller 100 transmits the second driving control signal CONT2 to the gate driver 200. The second driving control signal CONT2 may include a plurality of clock signals, which will be described later with reference to FIG. 11.

The display portion 800 includes a display area having a plurality of pixels. In the display portion 800, a plurality of gate lines that extend substantially in a row direction and are almost parallel with each other and a plurality of data lines that extend substantially in a column direction and are almost parallel with each other are formed to be connected to the pixels.

Each of the plurality of pixels may emit light of primary colors. The primary colors may exemplarily include red, green, and blue, and the three primary colors are spatially or temporally combined to obtain a desired color. A color may be displayed by a red pixel, a green pixel, and a blue pixel, and the red pixel, the green pixel, and the blue pixel may be collectively referred to as one pixel.

The gate driver 200 is connected to the plurality of gate lines, and generates a plurality of gate signals S[1] to S[n] according to the second driving control signal CONT2. The gate driver 200 may sequentially apply a gate signals S[1] to S[n] of a gate-on voltage to a corresponding gate line.

The data driver 300 is connected to a plurality of data lines, performs sampling and holding on the image data signal ImD according to the first driving control signal CONT1, and transmits a plurality of data voltages data[1]-data[m] to a plurality of data lines. The data driver 300 is synchronized with a time that the plurality of gate signals S[1] to S[n] respectively have the gate-on voltage, and thus applies the plurality of data voltages data[1] to data[m] according to the image data signal ImD to the plurality of data lines.

The backlight unit 400 includes at least one light source, and emits light toward the display portion 800 by receiving a backlight power source voltage VLED from an external device. As the light emitted from the backlight unit 400 passes through the display portion 800, the light is converted into a plurality of gray levels corresponding to the plurality of data signals data[1] to data[m] such that an image can be displayed. The backlight power source voltage VLED may be about, for example, 20 V to 30 V.

If the display device 10 in this embodiment is a light emitting display, the backlight unit 400 can be omitted, and each of the plurality of pixels may be self-emissive by including a light emission layer that includes an organic light emitting material or an inorganic light emitting material.

The power supply 500 receives a panel power source voltage VCC from an external device, and generates a first driving voltage VT and a second driving voltage VD. The first driving voltage VT and the second driving voltage VD are supplied to the signal controller 100. The first driving voltage VT and the second driving voltage VD may be used as power voltages to operate of the signal controller 100. In addition, the second driving voltage VD is supplied to the data driver 300. The second driving voltage VD may be used as a power source voltage to operate the data driver 300. The panel power source voltage VCC may be about 5 V, the first driving voltage VT may be about 1.2 V, and the second driving voltage VD may be about 1.8 V.

The thermoelectric generation portion 600 generates electrical energy (e.g., a current) by using heat generated by at least one of the signal controller 100, the data driver 300, the backlight unit 400, and the power supply 500. The thermoelectric generator may be constructed, for example of materials that may have a relatively high electrical conductivity and a relatively low thermal conductivity. The relatively low thermal conductivity may result in one side of the thermoelectric material being much hotter than another side during operation of the display device, and such a difference may result in generation of a voltage.

A configuration and operation of the thermoelectric generation portion 600 will be described in detail with reference to FIG. 2 and FIG. 3. In addition, an embodiment of arrangement of the thermoelectric generation portion 600 in the display device 10 will be subsequently described with reference to FIG. 5 to FIG. 11.

The thermoelectric generation portion 600 supplies the generated electrical energy to the converter 700. A voltage of about 3 to 5 V may be generated by the thermoelectric generation portion 600, and such a voltage may be transmitted to the converter 700.

The converter 700 may comprises a circuit that receives the voltage of about 3 to 5 V (in this embodiment) and converts a value of the voltage to output a first auxiliary voltage value VTs and a second auxiliary voltage value VDs by using electrical energy supplied from the thermoelectric generation portion 600. Moreover, the converter 700 may include a first converter 710 and a second converter 720, which will be described later with reference to FIG. 4. The first converter 710 may output a first auxiliary driving voltage VTs, and the second converter 720 may output a second auxiliary driving voltage VDs. The first auxiliary driving voltage VTs may be the same voltage, or about the same voltage as the first driving voltage VT, and the second auxiliary driving voltage VDs may be the same voltage, or about the same voltage as the second driving voltage VD. The first converter 710 and the second converter 720 may be comprised of step-down converters that step down the voltage of about 3 to 5 V, supplied from the thermoelectric generation portion 600, to a lower value (e.g., 1.2 V and 1.8 V) and output them. The first auxiliary driving voltage VTs may be supplied to the signal controller 100. The second auxiliary driving voltage VDs may be supplied to, for example, both the signal controller 100 and the data driver 300.

According to an embodiment of the inventive concept, the first auxiliary driving voltage VTs is being supplied to the signal controller 100, and thus the amount of current supplied to the signal controller 100 from the power supply 500 can be reduced. In addition, the second auxiliary driving voltage VDs in this embodiment is supplied to both the signal controller 100 and the data driver 300, the amount of current supplied to the signal controller 100 and the data driver 300 from the power supply 500 can be reduced.

Accordingly, the power supply 500 can reduce the amount of power that the power supply 500 obtains using the panel power source voltage VCC.

As discussed in part herein above, the display device 10 generates electrical energy using heat generated by at least one of the signal controller 100, the data driver 300, the backlight unit 400, and the power supply 500 and supplies the generated electrical energy as a power source voltage for operation of the signal controller 100 and the data driver 300. Accordingly, power consumption of the display device 10 can be reduced.

Figure 2:
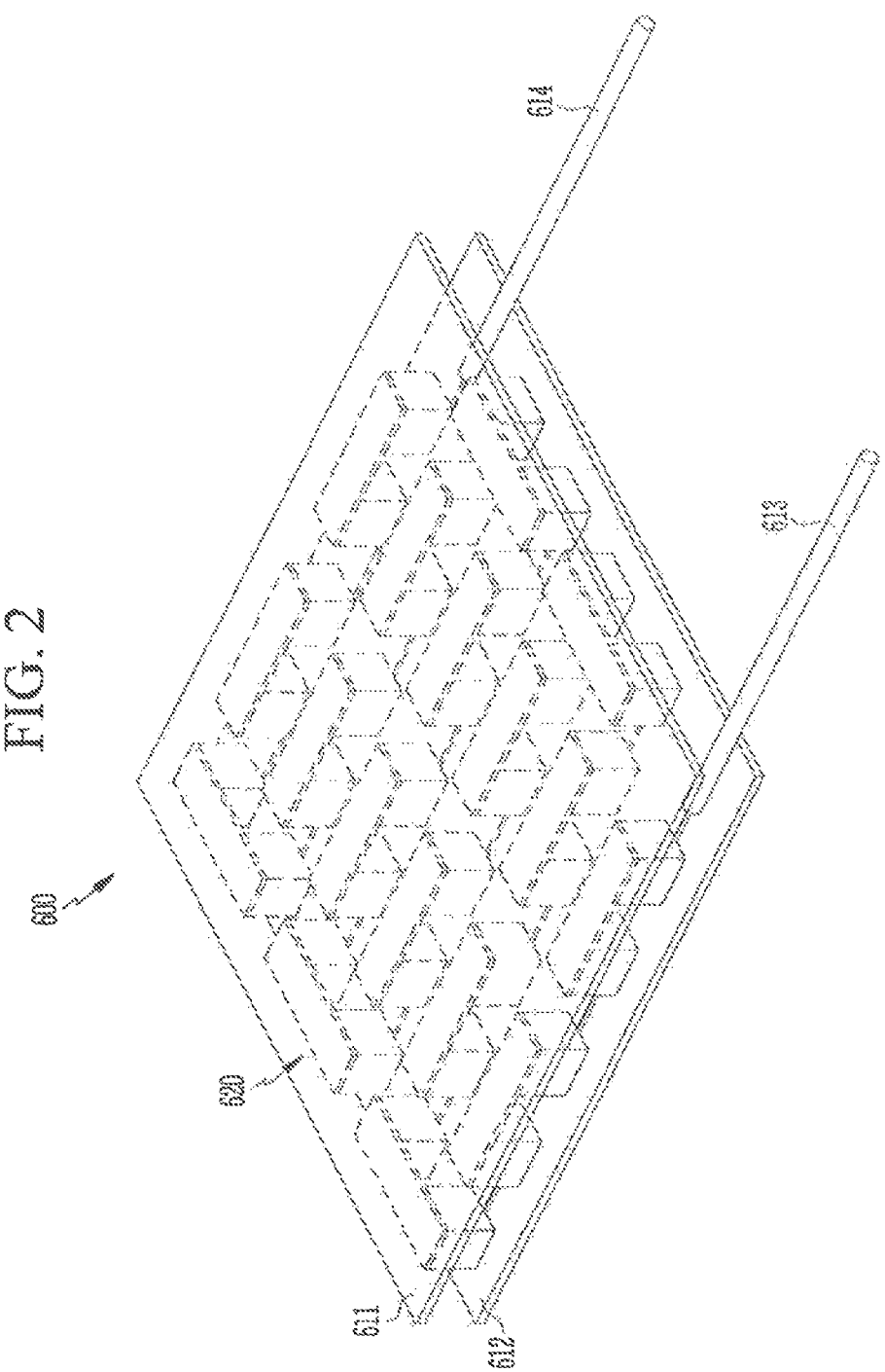
FIG. 2 shows a thermoelectric generator that may be included in the display device of FIG. 1.

FIG. 2 illustrates an example of a thermoelectric generator that may be included in the display device of FIG. 1. FIG. 3 shows a thermoelectric generator element that may be included in the thermoelectric generator of FIG. 2.

Figure 3:
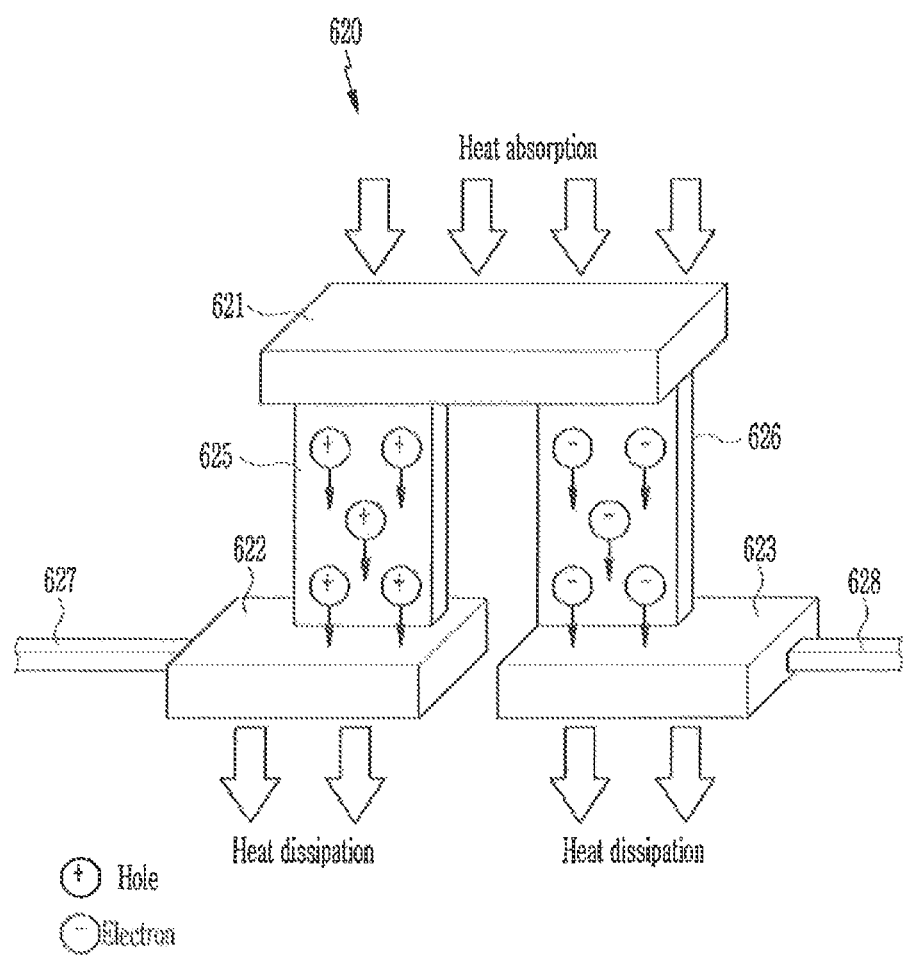
FIG. 3 exemplarily shows a thermoelectric generator element included in the thermoelectric generator of FIG. 2.

Referring now to FIG. 2 and FIG. 3, the thermoelectric generation portion 600 may include, for example, at least one of thermoelectric generation elements 620. The plurality of thermoelectric generation elements 620 that are shown in FIG. 3 are disposed between a first insulation substrate 611 and a second insulation substrate 612 and may be electrically coupled in series. A person of ordinary skill in the art should understand and appreciate that the number and arrangement of thermoelectric generation elements 620 is not limited to the arrangement shown in FIGS. 2 and 3.

With particular reference to FIG. 3, the thermoelectric generation elements 620 include a first terminal 621, a second terminal 622, a third terminal 623, a p-type semiconductor 625, and an n-type semiconductor 626. A first end of the p-type semiconductor 625 is connected to the first terminal 621 and a second end thereof is connected to the second terminal 622. One end of the first end of the n-type semiconductor 626 is connected to the first terminal 621 and the other end is connected to the third terminal 623. The first terminal 621, second terminal 622 and third terminal 623 each may include a conductive material.

When a temperature difference occurs between opposite ends of the p-type semiconductor 625, electron holes move to a low-temperature portion from a high-temperature portion. When a temperature difference occurs between opposite ends of the n-type semiconductor 626, electrons move to a low-temperature portion from a high-temperature portion. Accordingly, the high-temperature portion is negatively charged and the low-temperature portion is positively charged in the p-type semiconductor 625. In addition, the high-temperature portion is positively charged and the low-temperature portion is negatively charged in the n-type semiconductor 626. This flow of charges between the high-temperature portion and the low-temperature portion that creates a voltage difference between the different materials is referred to as a Seebeck effect.

When the first terminal 621 is maintained at a relatively high temperature, holes move to the second terminal 622 from the first terminal 621 such that a potential of the second terminal 622 is increased in the p-type semiconductor 625. In addition, in the n-type semiconductor 626, electrons move to the third terminal 623 from the first terminal 621 such that a potential of the third terminal 623 is decreased. Accordingly, an electromotive force is generated between the second terminal 622 and the third terminal 623 such that a current flows. Due to the movement of the holes and the electrons, heat absorption is carried out in the first terminal 621, and heat emission is carried out in the second terminal 622 and the third terminal 623.

The second terminal 622 is connected to a first connection wire 627, and the third terminal 623 is connected to a second connection wire 628.

The first connection wire 627 is connected to a second connection wire 628 of another adjacent thermoelectric generation element 620, and the second connection wire 628 is connected to a first connection wire 627 of still another adjacent thermoelectric generation element 620 such that the plurality of thermoelectric generation elements 620 can be electrically coupled in series. The current generated by the electromotive force of the plurality of thermoelectric generation elements 620 may flow to the converter 700 through a first power wire 613 and a second power wire 614.

With continued reference to FIG. 3, the first terminals 621 of the plurality of thermoelectric generation elements 620 contact the first insulation substrate 611, and the second terminals 622 and the third terminals 623 contact the second insulation substrate 612. In an arrangement of the thermoelectric generator, in which the first insulation substrate 611 contacts a heat generation portion and the second insulation substrate 612 contacts a non-heat generation portion, the plurality of thermoelectric generation elements 620 can generate a current. The heat generation portion of the display device 10 may be a portion having a relatively high temperature compared to the periphery, and the non-heat generation portion may be a portion having a relatively low temperature.

Although it is described that the thermoelectric generation elements 620 are disposed between the first insulation substrate 611 and the second insulation substrate 612, at least one of the first insulation substrate 611 and the second insulation substrate 612 may be omitted in the thermoelectric generation portion 600 according to an embodiment of the inventive concept. For example, the first terminal 621 of at least one thermoelectric generation element 620 may directly contact the heat generation portion of the display device 10, or the second terminal 622 and the third terminal 623 may directly contact the non-heat generation portion of the display device 10. In addition, the structure of the thermoelectric generator shown in FIG. 2 is an embodiment of the inventive concept, and a person of ordinary skill in the art should understand and appreciate that the shape of the first insulation substrate 611 and the shape of the second insulation substrate 612 or the arrangement of the thermoelectric generation elements 620 may be variously changed depending on a structure and a width of a location where the thermoelectric generator is placed.

Hereinafter, for better understanding and ease of description, the first insulation substrate 611, with which the first terminals 621 of the respective thermoelectric generation elements 620 are in contact, will be referred to as a "high-temperature portion" of the thermoelectric generation portion 600, and the second insulation substrate 612 with which the second terminals 622 and the third terminals 623 of the respective thermoelectric generation elements 620 are in contact will be referred to as "a low-temperature portion" of the thermoelectric generation portion 600. Depending on an embodiment, the first terminals 621 of the thermoelectric generation elements 620 may be a high-temperature portion of the thermoelectric generation portion 600, and the second terminal 622 and the third terminal 623 of the thermoelectric generation elements 620 may be a low-temperature portion of the thermoelectric generation portion 600.

Figure 4:
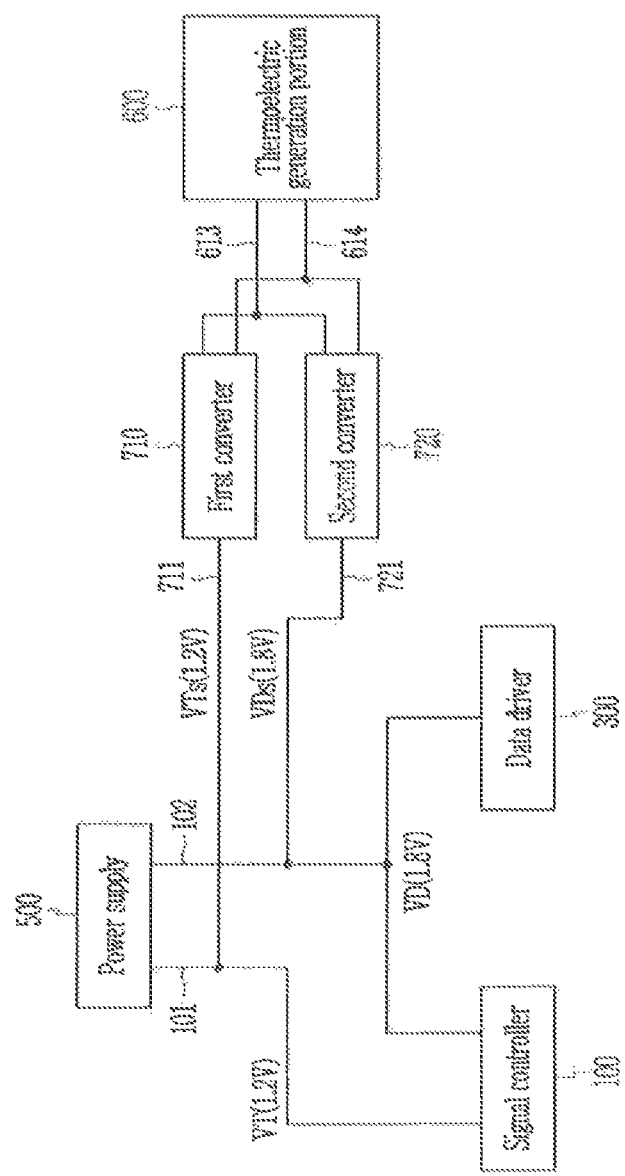
FIG. 4 is a block diagram illustrating a connection configuration of wiring through which a current generated by the thermoelectric generator of the display device of FIG. 1 flows.

FIG. 4 is an block diagram of a connection configuration of wires through which a current generated by the thermoelectric generation portion of the display device of FIG. 1 flows according to an embodiment of the inventive concept.

Referring now to FIG. 4, a first power wire 613 connected to the thermoelectric generation portion 600 is connected to the first converter 710 and the second converter 720. The second power wire 614 connected to the thermoelectric generation portion 600 is also connected to the first converter 710 and the second converter 720. The first converter 710 and the second converter 720 may receive electrical energy generated by the thermoelectric generation portion 600 through the first power wire 613 and the second power wire 614.

The power supply 500 and the signal controller 100 are connected to each other through a first driving voltage wire 101 and a second driving voltage wire 102. The first driving voltage VTs may be supplied to the signal controller 100 through the first driving voltage wire 101, and the second driving voltage VDs may be supplied to the data driver 300 through the second driving voltage wire 102.

The first converter 710 is connected to the first driving voltage wire 101 through a first auxiliary driving voltage wire 711. The first converter 710 may supply (e.g. output) a first auxiliary driving voltage VTs converted from the electrical energy supplied from the thermoelectric generation portion 600 to the first driving voltage wire 101 through the first auxiliary driving voltage wire 711. The first auxiliary driving voltage VTs may be about 1.2 V, which is about the same as the first driving voltage VT.

The power supply 500 and the data driver 300 are connected to each other through the second driving voltage wire 102. The second driving voltage VD may be supplied to the data driver 300 through the second driving voltage wire 102.

The second converter 720 is connected to the second driving voltage wire 102 through a second auxiliary driving voltage wire 721. The second converter 720 may output (e.g., supply) the second auxiliary driving voltage VDs by converting a voltage value of the electrical energy supplied from the thermoelectric generation portion 600 to the second driving voltage wire 102 through the second auxiliary driving voltage wire 721. The second auxiliary driving voltage VDs may be about 1.8 V, which is about the same as the second driving voltage VD received from the power supply 500.

Hereinafter, referring to FIG. 5, FIG. 6 and FIG. 7, an embodiment of the inventive concept in which an arrangement of a thermoelectric generation portion 600 will now be described in more detail.

Figure 5:
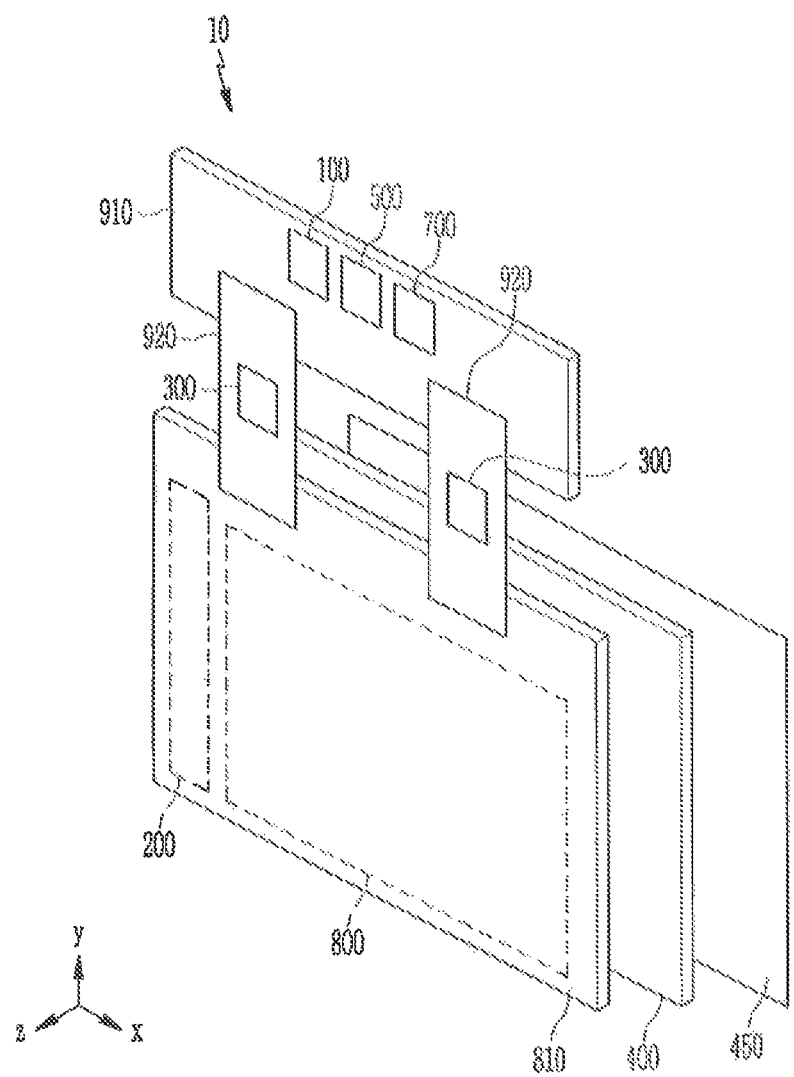
FIG. 5 is an exploded perspective view of an arrangement of thermoelectric generation modules in the display device of FIG. 1.

FIG. 5 is an exploded perspective view of a display device provided to illustrate an embodiment of an arrangement of the thermoelectric generation portion 600 in the display device of FIG. 1. FIG. 6 is a top plan view illustrating a state in which a printed circuit board is arranged at a rear side of the display device of FIG. 5, viewed from a rear side of the display device. FIG. 7 is a side view illustrating a state in which the printed circuit board is located at the rear side of the display device of FIG. 5.

Figure 6:
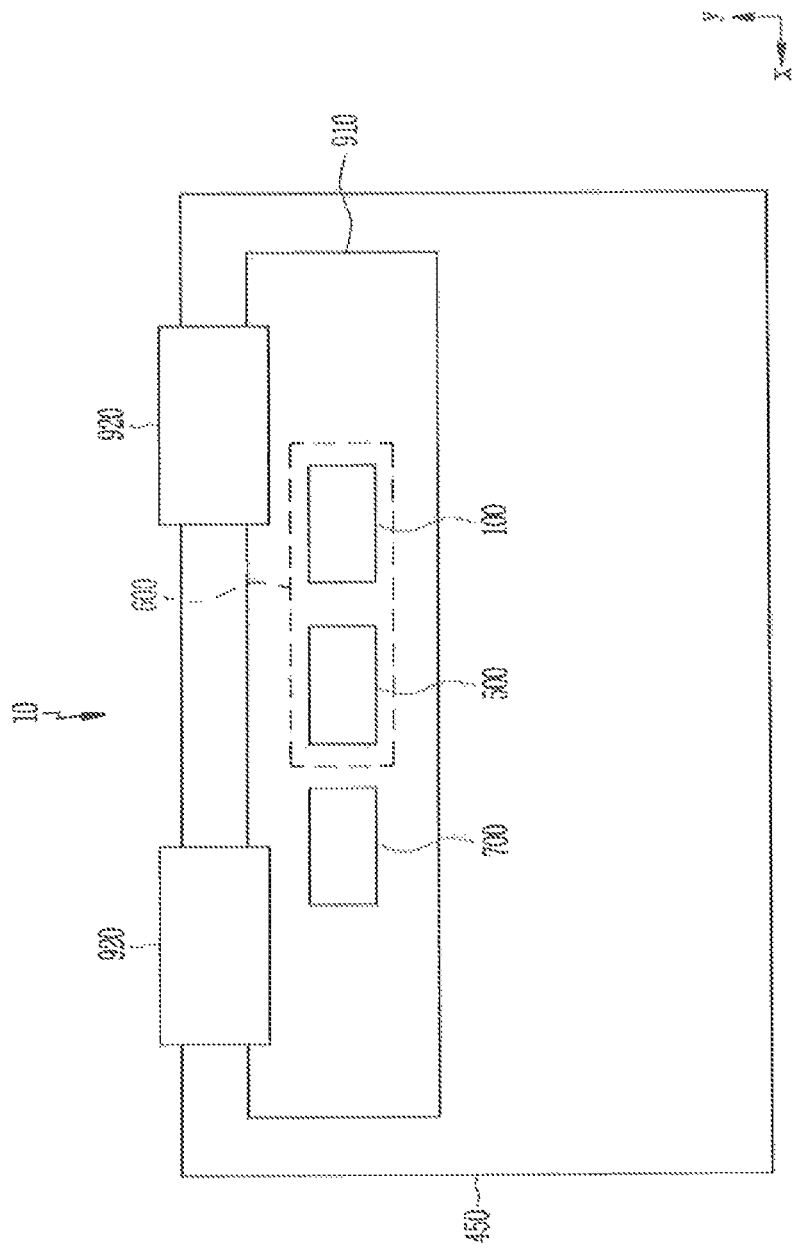
FIG. 6 is a top plan view of a location of a printed circuit board at a rear side of the display device, viewed from the rear of the display device.
Figure 7:
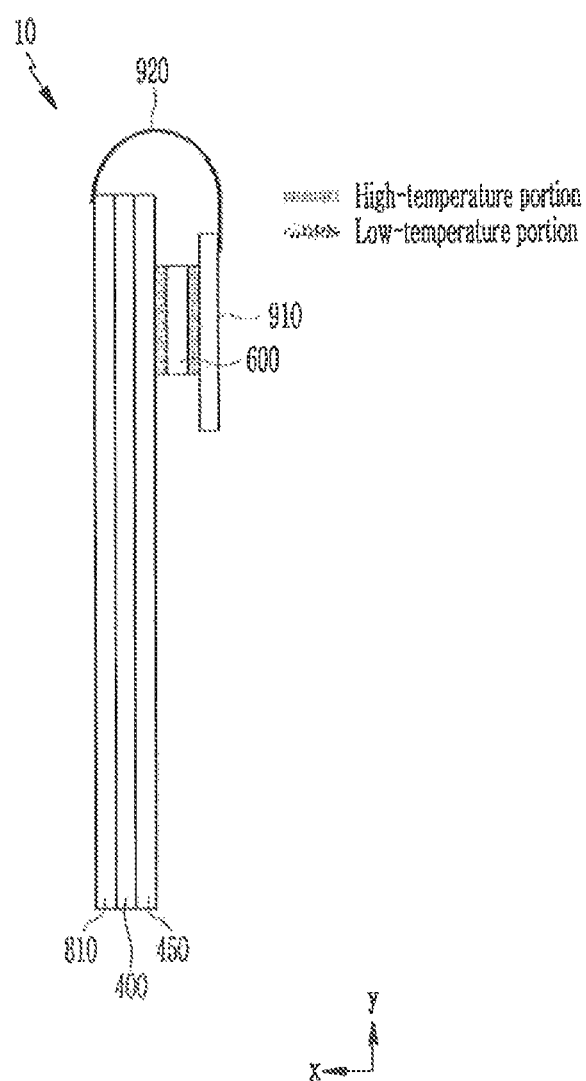
FIG. 7 is a side view of a location state of the printed circuit board at the rear side of the display device of FIG. 5.

Referring to FIG. 5 to FIG. 7, the gate driver 200 and the display portion 800 may be disposed in a display panel 810. However, the gate driver 200 may be disposed elsewhere in the device, e.g., a side of the display panel 810. The signal controller 100, the power supply 500, and the converter 700 may be disposed on a printed circuit board 910. The data driver 300 may be provided as an integrated circuit (IC) in a flexible printed circuit board 920 that is connected between the display panel 810 and the printed circuit board 910. Here, two flexible printed circuit boards 920 and two data drivers 300 are provided, but the number of flexible printed circuit boards 920 and the number of data drivers 300 is not restricted to the arrangement shown in FIG. 5. For example, although not shown in the drawing, the number of data drivers 300 may not correspond to the number of flexible printed circuit boards 920.

The backlight unit 400 (see FIG. 5) is disposed at a rear side of the display panel 810, and a heat dissipation substrate 450 may be disposed at a rear side of the backlight unit 400. The heat dissipation substrate 450 may include a metal material having excellent thermal conductivity such as aluminum or the like. A front side of the display panel 810 implies a side where an image is displayed, and the rear side of the display panel 810 implies the opposite side of the side where the image is displayed.

As shown in FIG. 5 and FIG. 7, the backlight unit 400 is attached to the rear side of the display panel 810, and the heat dissipation substrate 450 is attached to the rear side of the backlight unit 400. In addition, the flexible printed circuit board 920 may be bent (see FIG. 7) so as to arrange the printed circuit board 910 at the rear side of the heat dissipation substrate 450, which is at the rear side of the display panel 810. For example, the flexible printed circuit board 920 may be connected at one end to the front side of the display panel 810 and bent to connect to the printed circuit board 910 when the printed circuit board is positioned to the rear (e.g. behind) the heat dissipation substrate 450. In this case, the thermoelectric generation portion 600 is disposed between the heat dissipation substrate 450 and the printed circuit board 910. The high-temperature portion of the thermoelectric generation portion 600 may contact the printed circuit board 910, and the low-temperature portion may contact the heat dissipation substrate 450. Particularly, the thermoelectric generation portion 600 may overlap at least one of the signal controller 100 and the power supply 500 on a plane. For example, the signal controller 100 and the power supply 500 are disposed on one side of the printed circuit board 910, and the thermoelectric generation portion 600 may be disposed at a location of the other side of the printed circuit board 910, overlapping at least one of the signal controller 100 and the power supply 500.

With continued reference to FIGS. 6 and 7, the signal controller 100 and the power supply 500 may additionally comprise a heat dissipation portion having a relatively higher temperature than the periphery in the printed circuit board 910. In addition, the heat dissipation substrate 450 is a non-heat dissipation portion having excellent thermal conductivity and thus having a relatively low temperature.

Accordingly, the thermoelectric generation portion 600 (shown in FIGS. 6 and 7) may generate a current by a temperature difference between the high-temperature portion and the low-temperature portion, and the generated current may be transmitted to the converter 700 through a wire (not shown) formed in the printed circuit board 910. In addition, heat from the printed circuit board 910 is transmitted to the heat dissipation substrate 450 through the thermoelectric generation portion 600 so that a temperature of the printed circuit board 910 can be lowered.

Hereinafter, referring to FIG. 8 and to FIG. 9, another embodiment of an arrangement of the thermoelectric generation portion 600 will now be described.

Figure 8:
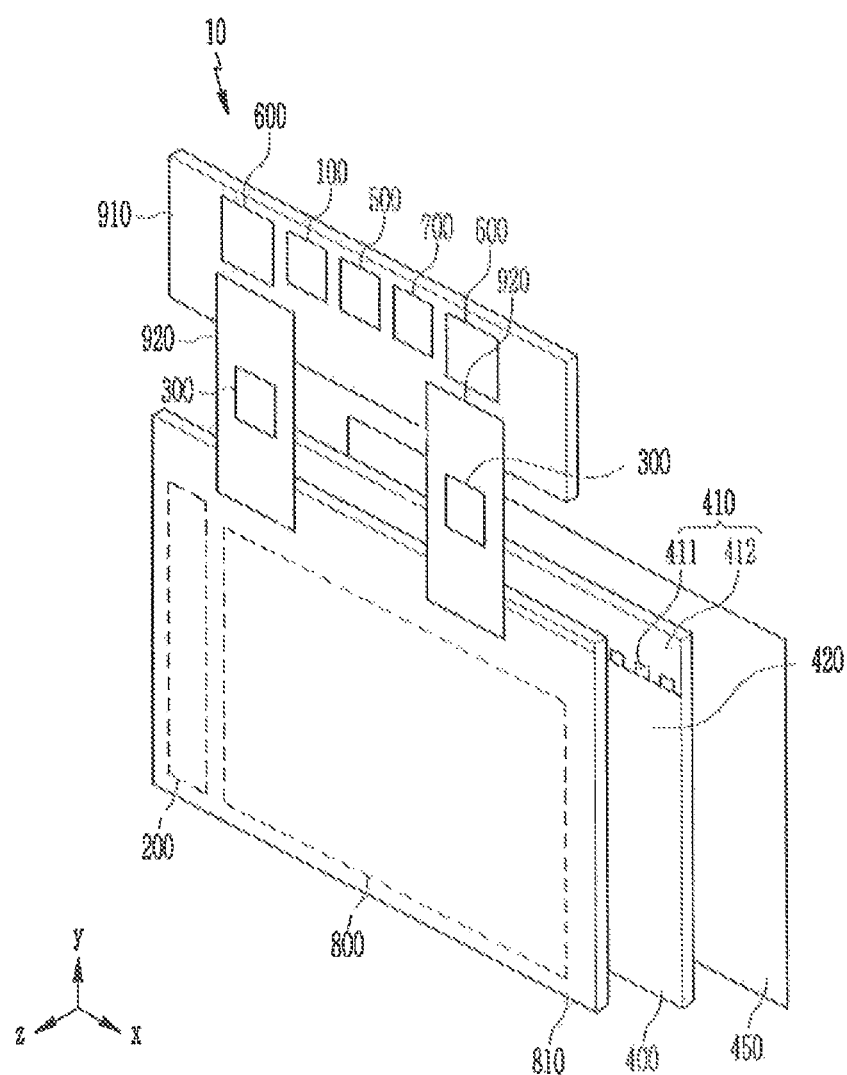
FIG. 8 is an exploded perspective view provided for description of another embodiment of arrangement of thermoelectric generation modules of the display device of FIG. 1.

FIG. 8 is an exploded perspective view of the display according to another embodiment of an arrangement of the thermoelectric generation portion 600 in the display device of FIG. 1. FIG. 9 is a top plan view of a state in which a printed circuit board 910 is disposed at a rear side of the display device of FIG. 8, viewed from the rear of the display device.

Figure 9:
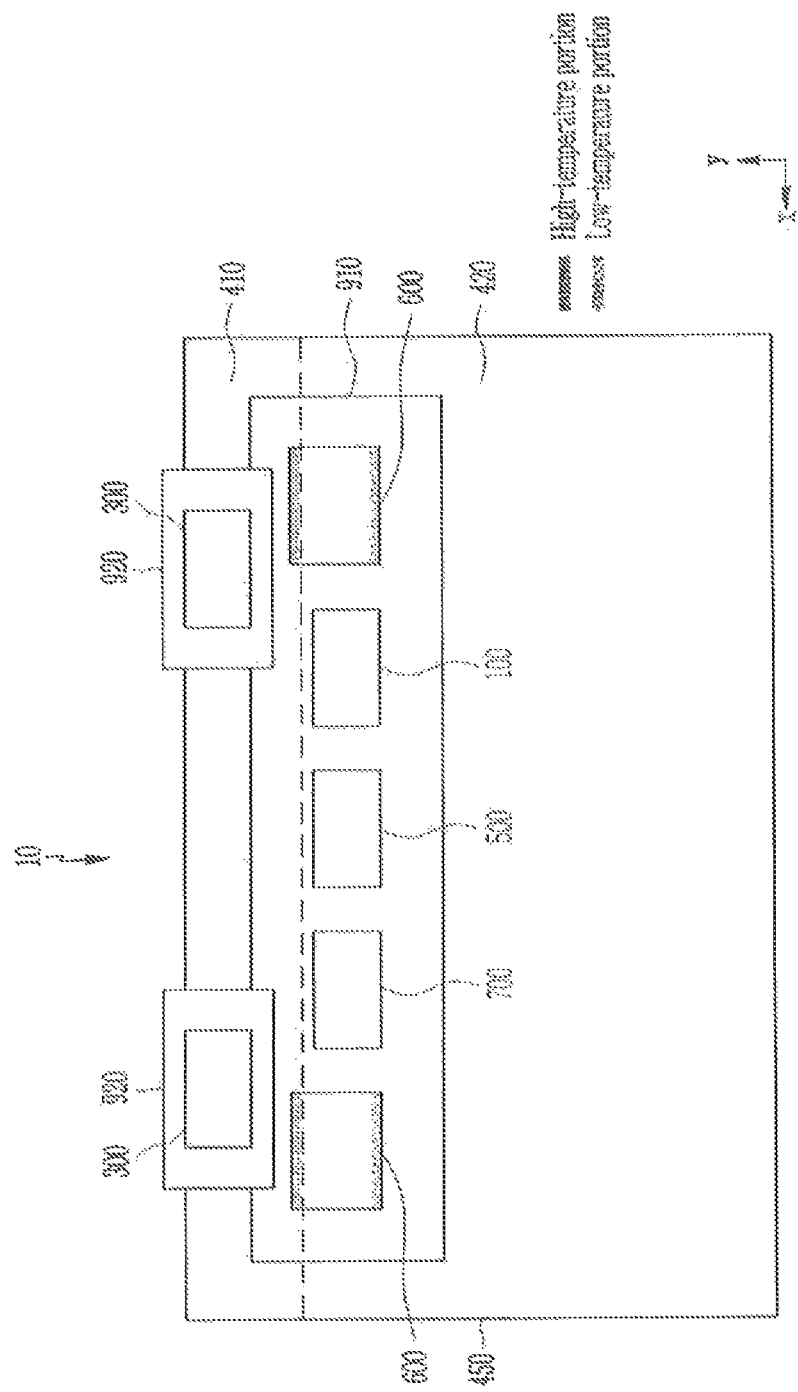
FIG. 9 is a top plan view of a state in which a printed circuit board is disposed at a rear side of the display device of FIG. 8, viewed from the rear of the display device.

Referring to FIG. 8 and FIG. 9, the backlight unit 400 may include a light source portion 410 that emits light and a light guide portion 420 that uniformly transmits the light emitted from the light source portion 410 throughout the entire surface of the display portion 800.

The light source portion 410 may include a backlight printed circuit board 412 where a plurality of light emitting diodes 411 are embedded, and may be disposed at one side of the light guide portion 420. When the printed circuit board 910 (on which the signal controller 100, the power supply 500, and the converter 700 are disposed) is placed at a rear side of the heat dissipation substrate 450, the light source portion 410 may partially overlap the printed circuit board 910 on a plane. The thermoelectric generation portion 600 may be disposed on the printed circuit board 910 where the signal controller 100, the power supply 500, and the converter 700 are disposed. In this case, the high-temperature portion of the thermoelectric generation portion 600 may overlap the light source portion 410, and the low-temperature portion may not overlap the light source portion 410.

The light source portion 410 is a heat dissipation portion having a relatively high temperature compared to the periphery, and a portion of the printed circuit board 910 not overlapping the light source portion 410 may be a non-heat dissipation portion having a relatively low temperature. Heat from the light source portion 410 may be transmitted to the printed circuit board 910 through the thermoelectric generation portion 600 so that a temperature of the light source portion 410 may be lowered, and according to the inventive concept the transmitted heat can be used by the thermoelectric portion to generate electric energy.

Meanwhile, the light source portion 410 may overlap the flexible printed circuit board 920 where the data driver 300 is embedded, and the high-temperature portion of the thermoelectric generation portion 600 may be adjacent to the data driver 300. Accordingly, heat from the data driver 300 is transmitted to the printed circuit board 910 through the thermoelectric generation portion 600 so that the temperature of the data driver 300 may be lowered.

In FIG. 9, two thermoelectric generation portions 600 are illustrated, but the number of thermoelectric generation portions 600 is not limited to two. In addition, the placement of the two thermoelectric generation portions 600 is not limited to the positions shown in FIG. 9.

The features of the embodiment described with reference to FIG. 5 to FIG. 7 may be applied to the embodiment described with reference to FIG. 8 and FIG. 9, and therefore a description of some of the features previously discussed with reference to FIG. 5 to FIG. 7 will be omitted during the discussion of FIGS. 8 and 9.

Hereinafter, referring to FIG. 10, another embodiment of an arrangement of the thermoelectric generation portion 600 will be described.

Figure 10:
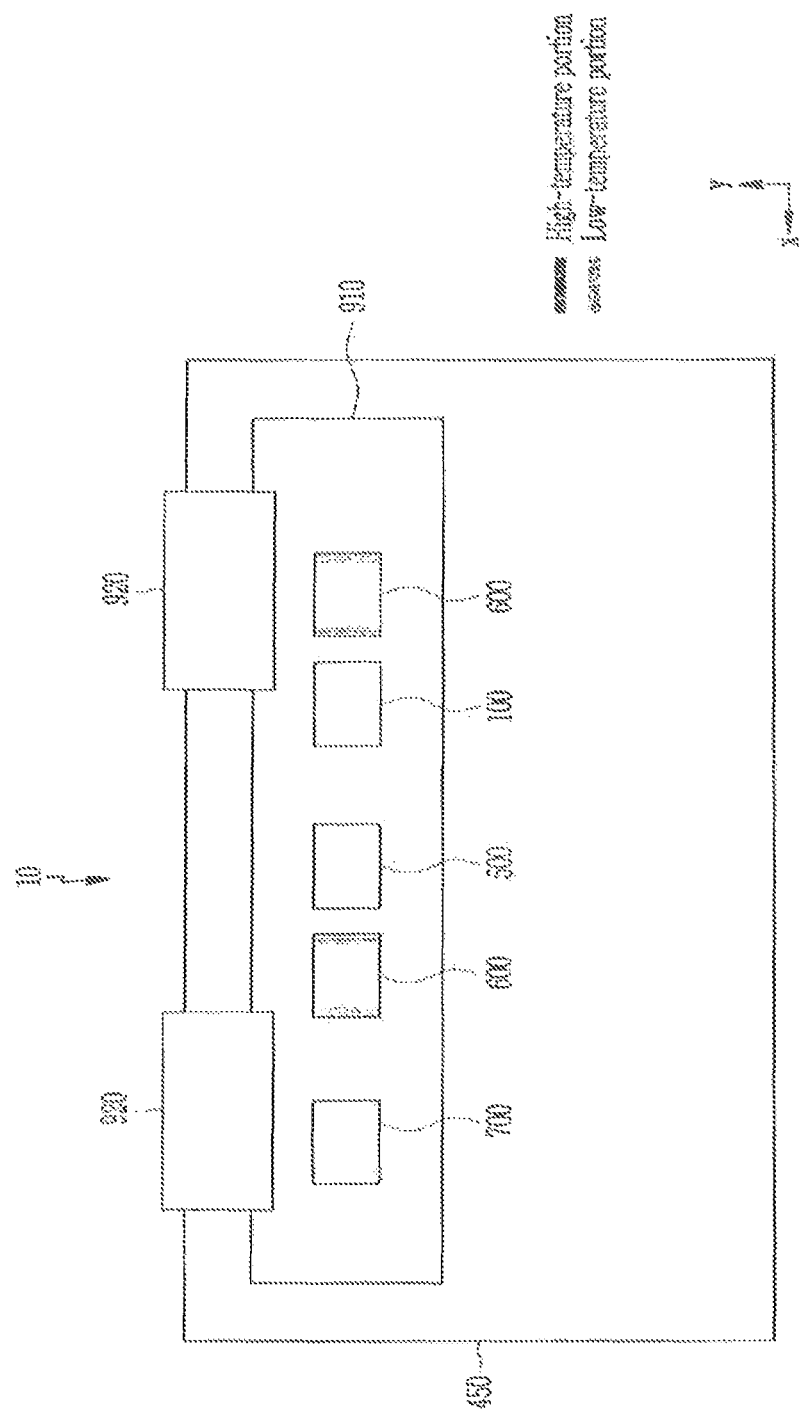
FIG. 10 is a top plan view of a state in which a printed circuit board is disposed at a rear side of the display device, viewed from the rear of the display device according to another embodiment of an arrangement of the thermoelectric generation portion in the display device of FIG. 1.

FIG. 10 is a top plan view of an arrangement in which a printed circuit board 910 is disposed at a rear side of the display device, viewed from the rear of the display device according to another embodiment of an arrangement of the thermoelectric generating portion in the display device of FIG. 1.

Referring now to FIG. 10, the thermoelectric generation portions 600 may be disposed adjacent to at least one of the signal controller 100 and the power supply 500 on the printed circuit board 910. The high-temperature portion of the thermoelectric generation portion 600 may be disposed closest to the signal controller 100 or may contact the signal controller 100, and the low-temperature portion of the thermoelectric generation portion 600 may be disposed in a portion having a relatively low temperature in the printed circuit board 910. Alternatively, the high-temperature portion of the thermoelectric generation portion 600 may be disposed closest to the power supply 500 and/or may contact the power supply 500, and the low-temperature portion of the thermoelectric generation portion 600 may be disposed in a portion in the printed circuit board 910 having a relatively low temperature. The power supply 500, for example, may generate more heat than the signal controller 100, so arranging the high-temperature portion closest to the power supply 500 may assist in maximizing heat transfer to the thermoelectric generation portion 600.

In addition, heat from the signal controller 100 and the power supply 500 may be transmitted to a portion having a relatively low temperature through the thermoelectric generation portions 600 so that temperatures of the signal controller 100 and the power supply 500 can be lowered.

FIG. 10 illustrates two thermoelectric generation portions 600, but the number of thermoelectric generation portions 600 is not restricted to two.

The features of the embodiment described with reference to FIG. 5 to FIG. 7 may be applied to the embodiment described with reference to FIG. 10, and therefore a description of the features previously-described with reference to FIG. 5 to FIG. 7 will be omitted in this discussion.

Hereinafter, referring to FIG. 11, another embodiment of an arrangement of the thermoelectric generation portions 600 will now be described.

Figure 11:
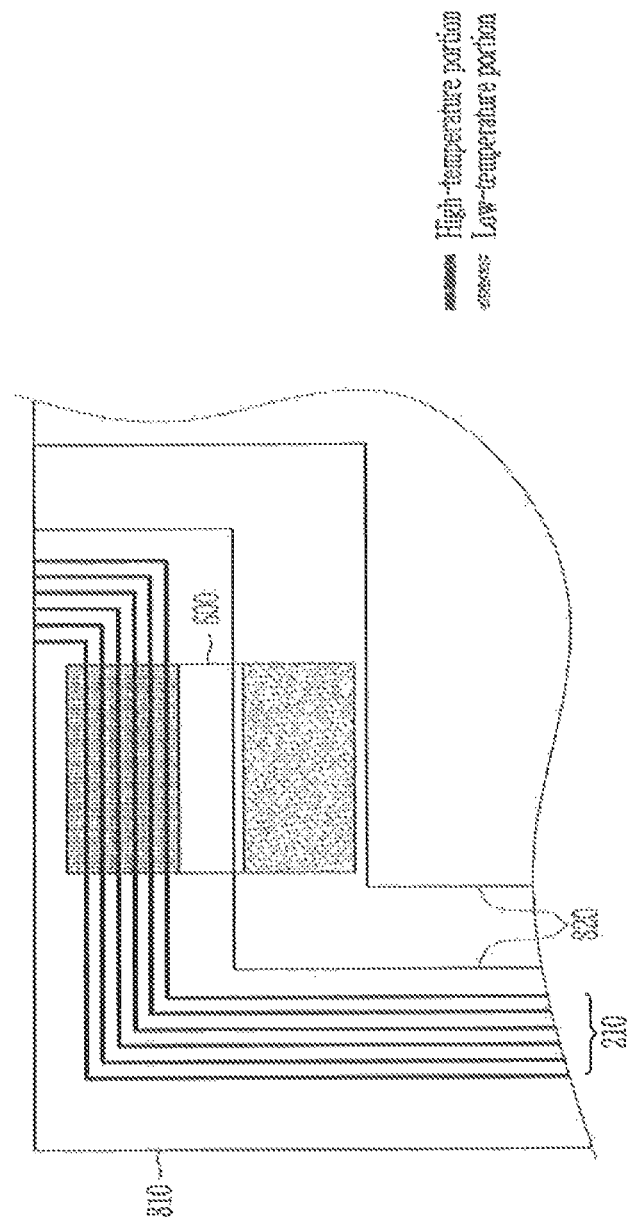
FIG. 11 shows a part of the display panel of the display device for description of another embodiment of an arrangement of the thermoelectric generation portions in the display device of FIG. 1.

FIG. 11 shows a part of the display panel 810 of the display device for description of another embodiment of an arrangement of the thermoelectric generation portions 600 in the display device of FIG. 1.

Referring now to FIG. 11, a plurality of clock wires 210 may be provided in the display panel 810 to transmit a plurality of clock signals to the gate driver 200 from the signal controller 100. The plurality of clock wires 210 may extend, for example, along an edge of the display panel 810 from the flexible printed circuit board 920 and thus may be connected to the gate driver 200.

In addition, a common voltage wire 820 may be disposed in the display panel 810 to transmit a reference voltage to the plurality of pixels. The common voltage wire 820 may be disposed adjacent to the plurality of clock wires 210.

With continued reference to FIG. 11, a width of the plurality of clock wires 210 may be different than that of the common voltage wire 820. Both the quantity of actual wires, and the distance between the wires may be different. For example, FIG. 11 shows 6 clock wires 210, and only a common voltage wire 820. In addition, the plurality of clock signals may be signals that fluctuate between a low voltage of about −12 V and about 30 V at regular intervals. Since such a plurality of clock signals having a high voltage difference are applied to the plurality of clock wires 210 having the small width there between, the plurality of clock wires 210 may be a high-temperature portion having a relatively high temperature compared to the periphery due to their resistances.

Meanwhile, the reference voltage may be a constant voltage of about 0 V and the common voltage wire 820 have the relatively large width there between, and therefore the common voltage wire 820 may be a low-temperature portion having a relatively low temperature.

The thermoelectric generation portion 600 may be disposed overlapping the plurality of clock wires 210 and the common voltage wire 820 on the display panel 810. The high-temperature portion of the thermoelectric generation portion 600 may overlap the plurality of clock wires 210, and the low-temperature portion may overlap the common voltage wire 820. The respective overlap of wires operating at different temperatures may cause current to flow in the thermoelectric generator.

Accordingly, the thermoelectric generation portion 600 may generate a current due to a temperature difference between the high-temperature portion and the low-temperature portion. A wire (not shown) may be provided in the display panel 810 to transmit a current generated by the thermoelectric generation portion 600, for example, to the converter 700, and the current of the thermoelectric generation portion 600 may be transmitted to the converter 700 of the printed circuit board 910 through the flexible printed circuit board 920. In addition, heat of the plurality of clock wires 210 is transmitted to the common voltage wire 820 through the thermoelectric generation portion 600 so that the temperature of the plurality of clock wires 210 may be lowered.

The embodiment of the arrangement of the thermoelectric generation portion 600 shown in FIG. 5 to FIG. 7, the embodiment shown in FIG. 8 and FIG. 9, the embodiment shown in FIG. 10, and the embodiment shown in FIG. 11 may be selectively iteratively applied to the display device 10.

Hereinafter, referring to FIG. 12, a display device according to another embodiment of the inventive concept will be described. Only a difference compared to the display device of FIG. 1 will be mainly described.

Figure 12:
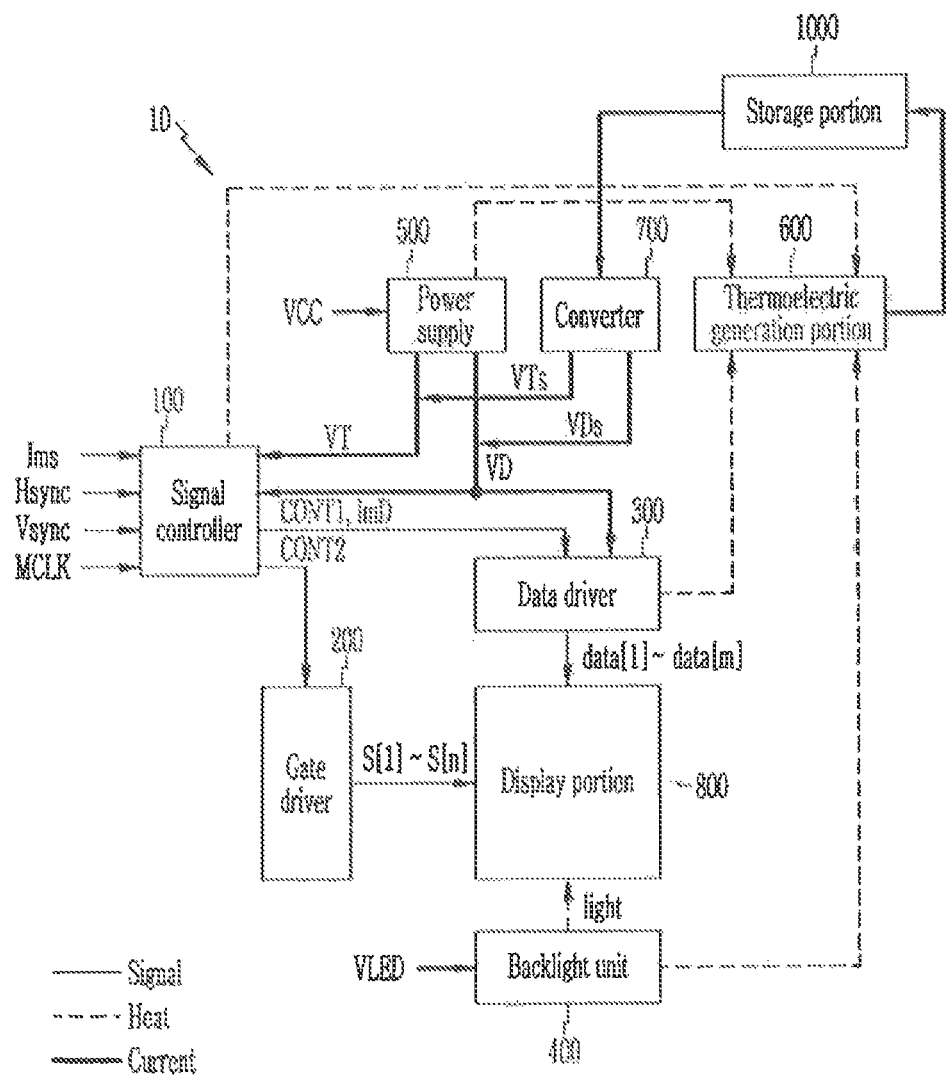
FIG. 12 is a block diagram of a display device according to an embodiment of the inventive concept.

FIG. 12 is a block diagram of a display device according to another embodiment of the inventive concept.

Referring to FIG. 12, a display device 10 may further include a storage portion 1000. In this embodiment, the storage portion 1000 is directly connected to the thermoelectric generation portion 600 and the converter 700.

A thermoelectric generation portion 600 supplies generated electrical energy to the storage portion 1000, and the storage portion 1000 charges the electrical energy supplied from the thermoelectric generation portion 600. The storage portion 1000 may include, for example, a rechargeable battery that can be iteratively charged and discharged. The storage portion 1000 discharges the charged electrical energy to the converter 700, and the converter 700 may convert the charged electrical energy supplied from the storage portion 1000 (e.g. battery) to a first auxiliary driving voltage VTs and a second auxiliary driving voltage VDs. Alternatively, it is possible that the storage portion 1000 could be capacitive, such capacitors may not store as much charge as a battery, and could be subject to leakage and relatively short cycles in which a charge is held when compared with, for example, a battery.

In addition, other features of the embodiment described with reference to FIG. 1 to FIG. 11 can be applied to the embodiment described with reference to FIG. 12, and therefore description of such features with regard to the embodiment of FIG. 12 will be omitted.

Hereinafter, referring to FIG. 13 to FIG. 15, a display device according to an embodiment of the inventive concept will be described. Only a particular difference compared to the embodiment of FIG. 1 will be described herein below.

Figure 13:
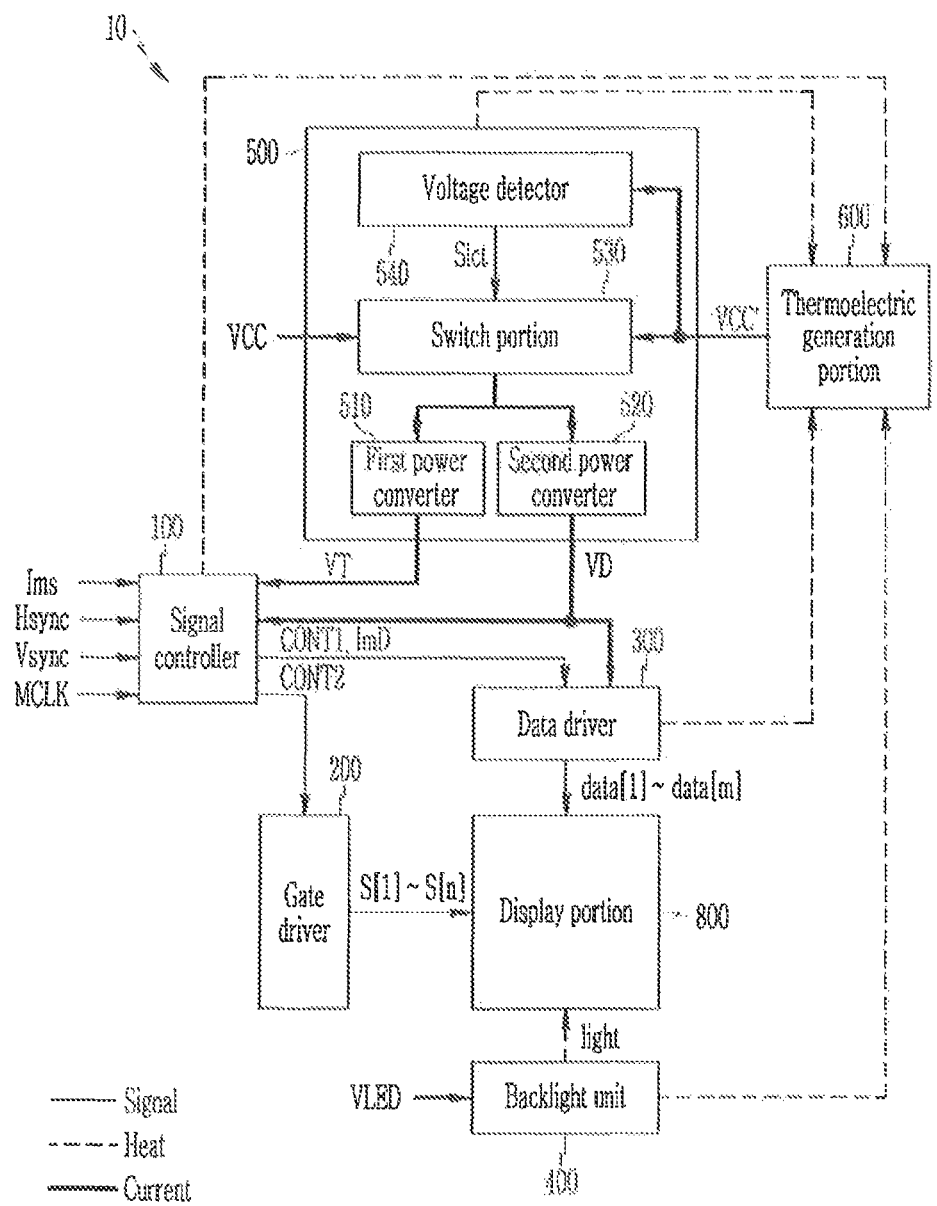
FIG. 13 is a block diagram of a display device according to an embodiment of the inventive concept.

FIG. 13 is a block diagram of a display device according to another embodiment of the inventive concept.

Referring now to FIG. 13, a power supply 500 may include a first power converter 510, a second power converter 520, a switch portion 530, and a voltage detector 540. A thermoelectric generation portion 600 may supply electrical energy generated from the heat radiated by the display device 10 to the power supply 500 as an auxiliary panel power source voltage VCC'. In this case, the converter 700 of FIG. 1 can be omitted.

The first power converter 510 receives a power voltage through the switch portion 530 and generates a first driving voltage VT.

The second power converter 520 receives a power voltage through the switch portion 530 and generates a second driving voltage VD.

The switch portion 530 receives a panel power voltage VCC from an external device, may also receive an auxiliary power voltage VCC' from the thermoelectric generation portion 600, and supplies one of the panel power voltage VCC and the auxiliary panel power source voltage VCC' to the first power converter 510 and the second power converter 520 according to receipt of a selection signal Slct. For example, the first power converter 510 and the second power converter 520 may receive one of the panel power voltage VCC and the auxiliary panel power source voltage VCC' as a power voltage.

The voltage detector 540 receives the auxiliary panel power source voltage VCC' from the thermoelectric generation portion 600, and detects whether the auxiliary panel power source voltage VCC' exceeds a threshold voltage that would indicate that VCC' is sufficiently large to be used in place of VCC from the external source. The voltage detector 540 generates the selection signal Slct to supply the panel power voltage VCC to the first power converter 510 and the second power converter 520 when the auxiliary panel power source voltage VCC' is lower than the threshold voltage, and transmits the generated selection signal Slct to the switch portion 530. When the auxiliary panel power source voltage VCC' exceeds the threshold voltage, the voltage detector 540 generates a selection signal Slct to supply the auxiliary panel power source voltage VCC' to the first power converter 510 and the second power converter 520, and transmits the selection signal Slct to the switch portion 530.

For example, when the panel power source voltage VCC is 5 V, the threshold voltage of the auxiliary panel power source voltage VCC' may be 5 V (e.g. about the same as the panel power source voltage VCC). Accordingly, when the auxiliary panel power source voltage VCC' generated by the thermoelectric generation portion 600 is lower than 5 V, the first driving voltage VT and the second driving voltage VD are generated by using the panel power voltage VCC supplied from the external device/source, and when the auxiliary panel power source voltage VCC' generated by the thermoelectric generation portion 600 is 5 V or higher, the first driving voltage VT and the second driving voltage VD can be generated by using the auxiliary panel power source voltage VCC'.

Although it has been described in the above examples that the voltage detector 540 is included in the power supply 500, the voltage detector 540 may be provided separately from the power supply 500. In addition, the voltage detector 540 maybe be comprised of, for example, a comparator circuit.

In addition, the features described with reference to FIG. 1 through FIG. 11 can be applied to the embodiment described with reference to FIG. 13, and therefore such a description of the features of FIG. 13 will be omitted.

Figure 14:
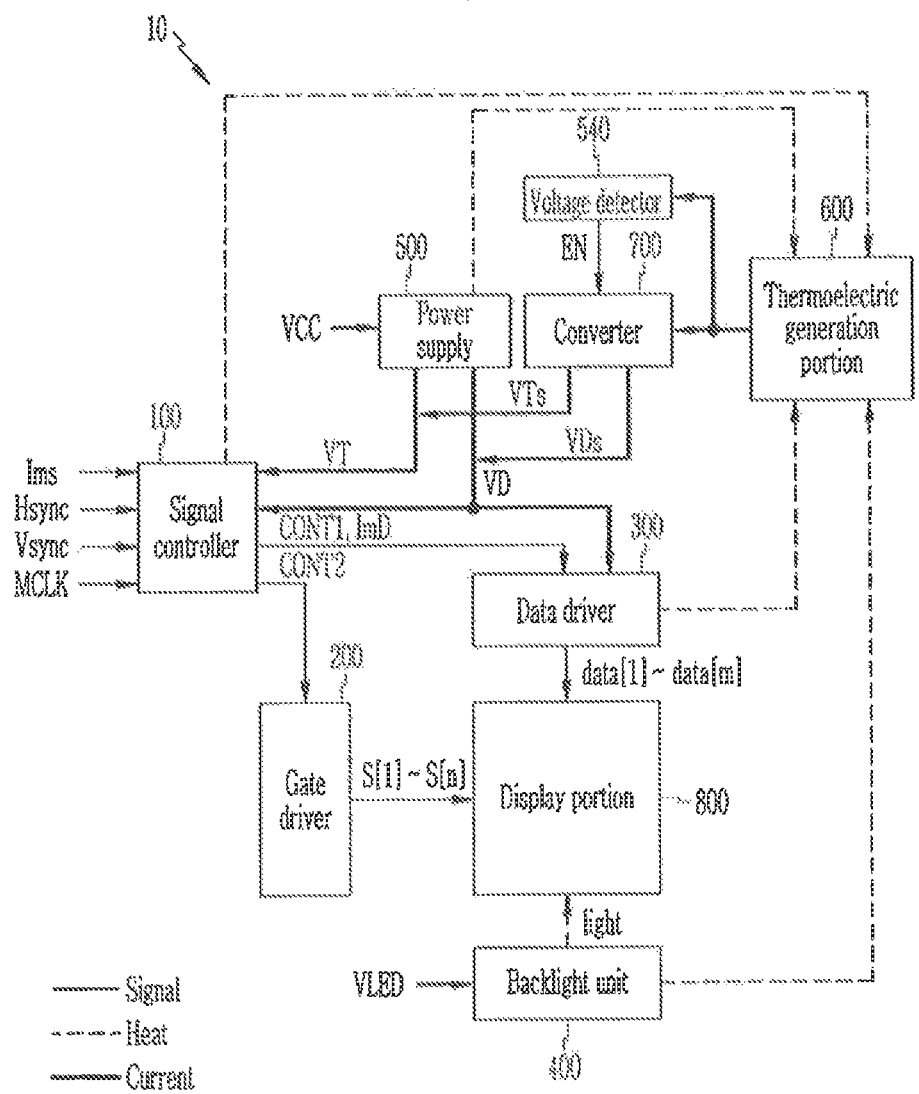
FIG. 14 is a block diagram of a display device according to an embodiment of the inventive concept.

FIG. 14 is a block diagram of a display device according to another embodiment of the inventive concept.

Referring to FIG. 14, a display device 10 may further include a voltage detector 540. It can also be seen that FIG. 14 does show a switch as in the previous arrangement of FIG. 13, and there is a single converter 700.

The voltage detector 540 receives electrical energy from a thermoelectric generation portion 600, and detects whether a voltage of the electrical energy exceeds a threshold voltage. The threshold voltage may be set to a voltage between, for example, about 3 V and 5 V.

When the voltage of the electrical energy supplied from the thermoelectric generation portion 600 exceeds the threshold voltage, the voltage detector 540 may generate an enable signal EN that enables a converter 700 to operate and transmit the enable signal EN to the converter 700. When the voltage of the electrical energy supplied from the thermoelectric generation portion 600 is lower than the threshold voltage, the voltage detector 540 blocks transmission of the enable signal EN to stop operation of the converter 700.

Accordingly, with continued reference to FIG. 14, when the voltage of the electrical energy supplied from the thermoelectric generation portion 600 is lower than the threshold voltage, the display device 10 is driven by using the first driving voltage VT and the second driving voltage VD generated by the power supply 500, and when the voltage of the electrical energy supplied from the thermoelectric generation portion 600 is higher than the threshold voltage, the display device 10 can be driven by using the first driving voltage VT and the second driving voltage VD generated by the power supply 500 and the first auxiliary driving voltage VTs and the second auxiliary driving voltage VDs generated by using the electrical energy generated by the thermoelectric generation portion 600.

Except for such a difference, features described with reference to FIG. 1 to FIG. 11 can be applied to the embodiment described with reference to FIG. 14, and therefore to avoid redundancy, a description of these features will be omitted.

Figure 15:
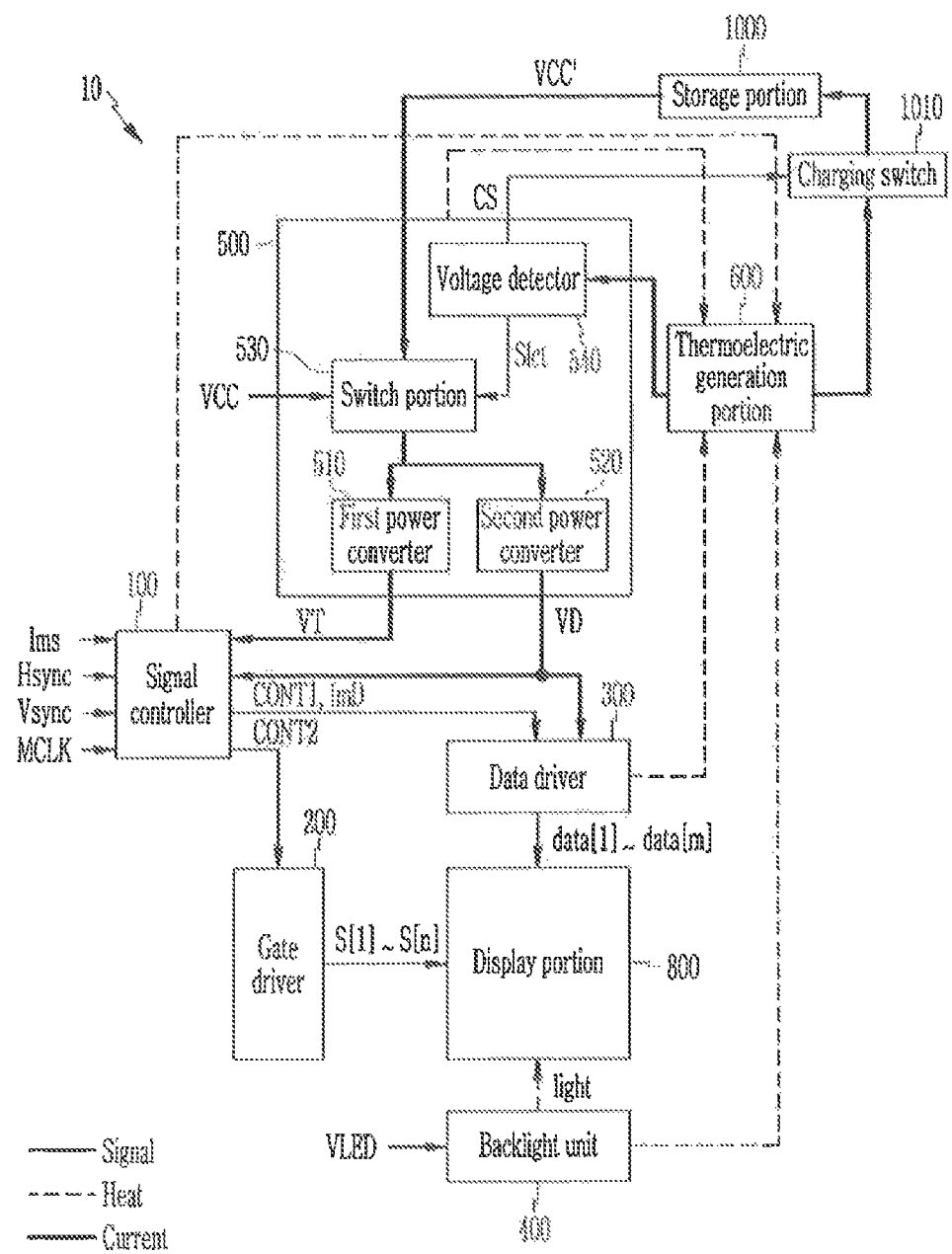
FIG. 15 is a schematic block diagram of a display device according to an embodiment of the inventive concept.

FIG. 15 is a schematic block diagram of a display device according to another embodiment of the inventive concept.

Referring to FIG. 15, a display device 10 may further include a storage portion 1000 and a charging switch 1010. In addition, the power supply 500 may include a first power converter 510, a second power converter 520, a switch portion 530, and a voltage detector 540.

The thermoelectric generation portion 600 may supply generated electrical energy to the storage portion 1000 through the charging switch 1010. The storage portion 1000 may be a rechargeable battery. In this case, the thermoelectric generation portion 600 may supply the electrical energy to the voltage detector 540.

The charging switch 1010 is connected between the thermoelectric generation portion 600 and the storage portion 1000, and is turned on/off according to a charge signal CS from the voltage detector 540.

The storage portion 1000 stores electrical energy supplied from the thermoelectric generation portion 600 via the charging switch 1010. The storage portion 1000 may include a rechargeable battery that can be charged and discharged. The storage portion 1000 supplies the charged electrical energy to the power supply 500 as an auxiliary panel power source voltage VCC'.

The first power converter 510 receives the power voltage through the switch portion 530 and generates a first driving voltage VT.

The second power converter 520 receives the power voltage through the switch portion 530 and generates a second driving voltage VD.

The switch portion 530 receives a panel power voltage VCC from an external device, receives an auxiliary panel power source voltage VCC' from the storage portion 1000, and supplies one of the panel power voltage VCC and the auxiliary panel power source voltage VCC' to the first power converter 510 and the second power converter 520 according to a selection signal Slct from the voltage detector 540. For example, the first power converter 510 and the second power converter 520 may receive one of the panel power voltage VCC and the auxiliary panel power source voltage VCC' as a power voltage.

The voltage detector 540 detects whether a voltage of electrical energy generated by the thermoelectric generation portion 600 exceeds a threshold voltage. The threshold voltage may be set to a voltage between about 3 V and 5 V.

The voltage detector 540 transmits a charge signal CS that turns on (e.g. activates) the charging switch 1010 when the voltage of the electrical energy provided from the thermoelectric generation portion 600 is higher than the threshold voltage, the electrical energy charges the storage portion 1000 with the electrical energy generated by the thermoelectric generation portion 600. In this case, the voltage detector 540 generates the selection signal Slct and transmits the selection signal Slct to the switch portion 530 for supplying of the auxiliary panel power source voltage VCC' to the first power converter 510 and the second power converter 520. Accordingly, the first driving voltage VT and the second driving voltage VD are generated by using the electrical energy stored in the storage portion 1000 such that the display device 10 can be driven with electrical energy generated by the heat generated by various components of the display device 10. For example, one or more of the signal controller 100, gate driver 200, data driver 300, backlight unit 400, power supply 500 emits heat that is used by the thermoelectric generation portion 600 to convert the heat energy into electrical energy, and via at least one converter 700 the electrical energy can be converted to a voltage level that can be used for operation of the display device instead of an external power source.

The voltage detector 540 transmits the charge signal CS that turns off the charging switch 1010 to the charging switch 1010 when the voltage of the electrical energy provided from the thermoelectric generation portion 600 is lower than the threshold voltage to stop charging of the storage portion 1000. In this case, the voltage detector 540 generates a selection signal Slct and transmits the selection voltage Slct to the switch portion 530 for supplying of the panel power voltage VCC to the first power converter 510 and the second power converter 520 to thereby generate the first driving voltage VT and the second driving voltage VD by using the panel power voltage VCC.

Although it has been exemplarily described that the voltage detector 540 is included in the power supply 500, the voltage detector 540 may be provided separately from the power supply 500.

Except for such a difference, features described with reference to FIG. 1 through FIG. 11 can be applied to the embodiment described with reference to FIG. 14, and therefore to avoid redundancy, a description of these features will be omitted.

As described above, when heat is generated by a heat generation portion such as the signal controller 100, the data driver 300, the backlight unit 400, the power supply 500, and the like according to driving of the display device 10, the thermoelectric generation portion 600 generates electrical energy in the form of an auxiliary power voltage for operation of the signal controller 100 and the data driver 300 and decreases a temperature of the heat generation portion. The display device may be partially or even fully powered because of the generated heat being supplied to the thermoelectric may provide an auxiliary voltage. When the temperature of the heat generation portion is decreased, the display device 10 is driven by using the panel power voltage VCC, and when the temperature of the heat generation portion is increased, the thermoelectric generation portion 600 generates electrical energy again such that the heat generated by the display device 10 can be used to provide self-power for some of the components.

Although the at least one embodiment of the inventive concept discloses that the device is powered by the external source VCC and may also be powered via an internally created source VCC' based on a thermoelectric generation of electricity based on heat released by one or more components of the display device 10, it also possible for partially powering the display device by both the voltage from the heat released, and by the external source VCC. In such a case, the amount of power from the external source would be reduced.

In addition, it is within the inventive concept that certain components may be powered by the thermoelectric generation, and with an increase in the amount of energy due to an increase in heat being generated, additional components could be powered.

It is also within the inventive concept that a device could be primarily operated via a battery, and the radiation of heat from components that is used to generate energy could serve to be a battery charger. The battery charger that operates in this manner could also be supplemented with other chargers (such as a wall-plug charger) and/or a solar cell.

While the inventive concept has been described in connection with what is presently considered to be practical example embodiments, it is to be understood that the inventive concept is not limited to the disclosed embodiments, but, on the contrary, is intended to cover various modifications and equivalent arrangements included within the spirit and scope of the appended claims. Therefore, it will be appreciated by a person of ordinary skilled in the art that various modifications may be made and other equivalent embodiments are available. Therefore, a true technical scope of the inventive concept will be defined by the technical spirit of the appended claims.

What is claimed is:
1. A display device comprising:
a display panel including a plurality of pixels;
a data driver that applies a data signal to data lines connected to the plurality of pixels;
a signal controller configured to transmit an image data signal for generation of the data signal to the data driver;
a power supply configured to generate a first driving voltage and supply the first driving voltage to the signal controller as a first power voltage for operation of the signal controller;
a thermoelectric generation circuit configured to generate electrical energy from heat generated by at least one of the signal controller, the power supply, and the data driver; and
a converter configured to convert the electrical energy to a first auxiliary driving voltage and supply the first auxiliary driving voltage to the signal controller as a second power voltage for operation of the signal controller, wherein the second power voltage comprises a different voltage level from the first power voltage.
2. A display device comprising:
a display panel including a plurality of pixels;
a data driver that applies a data signal to data lines connected to the plurality of pixels;

a signal controller configured to transmit an image data signal for generation of the data signal to the data driver;

a power supply configured to generate a first driving voltage and supply the first driving voltage to the signal controller as a first power voltage for operation of the signal controller;

a thermoelectric generation circuit configured to generate electrical energy from heat generated by at least one of the signal controller, the power supply, and the data driver; and a converter configured to convert the electrical energy to a first auxiliary driving voltage and supply the first auxiliary driving voltage to the signal controller as a second power voltage for operation of the signal controller, wherein the power supply generates a second driving voltage and supplies the second driving voltage to the signal controller as a third power voltage for operation of the signal controller, and the converter converts the electrical energy to a second auxiliary driving voltage and supplies the second auxiliary driving voltage to the signal controller as a fourth power voltage for operation of the signal controller.

3. The display device of claim 2, wherein the first auxiliary driving voltage has a voltage level that is about the same as the first driving voltage generated by the power supply, and the second auxiliary driving voltage has a voltage level that is about the same as the second driving voltage generated by the power supply.

4. The display device of claim 2, wherein the power supply supplies the second driving voltage to the data driver, and the converter supplies the second auxiliary driving voltage to the data driver.

5. The display device of claim 2, wherein the converter circuit converts the electrical energy to the first auxiliary driving voltage and the second auxiliary driving voltage by reducing a voltage of the electrical energy generated by the thermoelectric generation circuit.

6. The display device of claim 2, wherein the electrical energy comprises a first electrical energy and a second electrical energy, and the converter comprises:

a first converter that converts the first electrical energy and outputs the first auxiliary driving voltage; and a second converter that converts the second electrical energy and outputs the second auxiliary driving voltage, wherein the first converter and the second converter are step-down converters that reduce a voltage of the first electrical energy and the second electrical energy generated by the thermoelectric generation circuit to a particular voltage value.

7. The display device of claim 1, further comprising:

a printed circuit board on which the signal controller and the power supply are disposed; and a flexible printed circuit board connected between the display panel and the printed circuit board, and where the data driver is disposed.

8. The display device of claim 7, further comprising a heat dissipation substrate that is disposed at a rear side of the display panel, wherein the thermoelectric generation circuit is disposed between the printed circuit board and the heat dissipation substrate.

9. The display device of claim 8, wherein the thermoelectric generation circuit comprises a high-temperature portion that contacts the printed circuit board and a low-temperature portion that contacts the heat dissipation substrate.

10. The display device of claim 9, wherein the thermoelectric generation circuit overlaps at least one of the signal controller and the power supply.

11. The display device of claim 9, wherein the high-temperature portion of the thermoelectric generation circuit overlaps a plurality of clock wires, and the low-temperature portion overlaps a common voltage wire adjacent the plurality of clock wires.

12. The display device of claim 7, further comprising a backlight unit that emits light toward the display panel, wherein the thermoelectric generation circuit generates the electrical energy from heat generated by the backlight unit.

13. The display device of claim 12, wherein the backlight unit comprises a light source portion that is arranged to partially overlap the printed circuit board, and the thermoelectric generation circuit comprises a high-temperature portion that overlaps the light source portion and a low-temperature portion that does not overlap the light source portion.

14. The display device of claim 13, wherein the low-temperature portion of the thermoelectric generation circuit is disposed on the printed circuit board.

15. The display device of claim 7, wherein the thermoelectric generation circuit is disposed on the printed circuit board, and comprises a high-temperature portion that is disposed adjacent to at least one of the signal controller and the power supply and a low-temperature portion that is disposed in a portion having a relatively low temperature in the printed circuit board.

16. A display device comprising:

a display panel including a plurality of pixels;

a data driver that applies a data signal to data lines connected to the plurality of pixels;

a signal controller configured to transmit an image data signal for generation of the data signal to the data driver;

a power supply configured to generate a first driving voltage and supply the first driving voltage to the signal controller as a first power voltage for operation of the signal controller;

a thermoelectric generation circuit configured to generate electrical energy from heat generated by at least one of the signal controller, the power supply, and the data driver;

a converter configured to convert the electrical energy to a first auxiliary driving voltage and supply the first auxiliary driving voltage to the signal controller as a second power voltage for operation of the signal controller;

a gate driver configured to apply a gate signal to gate lines connected to the plurality of pixels;

a plurality of clock wires connected to the gate driver; and common voltage wires transmitting a reference voltage to the plurality of pixels, wherein the thermoelectric generation circuit overlaps the plurality of clock wires and the common voltage wires.

17. The display device of claim 16, wherein the thermoelectric generation circuit is disposed on a display panel where the plurality of pixels, the plurality of clock wires, and the common voltage wires are disposed.

18. The display device of claim 16, wherein the thermoelectric generation circuit comprises a high-temperature portion that overlaps the plurality of clock wires and a low-temperature portion that overlaps the common voltage wires.

19. The display device of claim 1, further comprising a storage circuit storing electrical energy generated by the thermoelectric generation circuit,
   wherein the storage circuit discharges the stored electrical energy to the converter circuit.

20. The display device of claim 1, further comprising a voltage detector circuit that detects whether a voltage of the electrical energy generated by the thermoelectric generation circuit exceeds a threshold voltage, and transmits an enable signal that operates the converter circuit when the voltage of the electrical energy exceeds the threshold voltage.

\* \* \* \* \*